United States Patent [19]

Wolk

[11] Patent Number: 5,488,334
[45] Date of Patent: Jan. 30, 1996

[54] AIR-COOLED POWER LOAD

[75] Inventor: Ivan Wolk, Arnouville les Gonesse, France

[73] Assignee: Thomcast, Conflans Ste Honorine, France

[21] Appl. No.: 417,767

[22] Filed: Apr. 6, 1995

[30] Foreign Application Priority Data

Apr. 8, 1994 [FR] France .................................. 94 04169

[51] Int. Cl.⁶ .............................. H01P 1/26; H01C 3/12
[52] U.S. Cl. .......................... 333/22 F; 338/58; 338/206; 338/280
[58] Field of Search ................................ 333/22 R, 22 F; 338/58, 206, 208, 273, 280, 283, 284

[56] References Cited

U.S. PATENT DOCUMENTS

| 1,563,363 | 12/1925 | Hibbard | 338/58 |
| 2,087,573 | 7/1937 | Hamilton | 338/206 |
| 2,825,874 | 3/1958 | Kaadoiao et al. | 333/22 F |
| 4,151,398 | 4/1979 | Maake | 338/280 X |
| 5,113,171 | 5/1992 | El-Hamamsy | 338/61 |
| 5,396,198 | 3/1995 | Yamashita et al. | 333/22 R X |

FOREIGN PATENT DOCUMENTS

| 0117778A1 | 9/1984 | European Pat. Off. |
| 395363 | 7/1933 | United Kingdom. |
| 1134091 | 11/1968 | United Kingdom. |

*Primary Examiner*—Paul Gensler
*Attorney, Agent, or Firm*—Oblon, Spivak, McClelland, Maier & Neustadt

[57] ABSTRACT

The power loads in certain applications such as dummy antennas must have a substantially constant impedance in a wide band of frequencies. The power load is air-cooled and its resistive element is constituted by the series-connection of resistor modules made of expanded metal. Capacitors are positioned in a branching connection on the resistive element. The positioning of the capacitors along the resistive element and their value are determined to ensure frequency compensation.

6 Claims, 4 Drawing Sheets

AIR-COOLED POWER LOAD

BACKGROUND OF THE INVENTION

1. Field of the Invention

The present invention relates to a power load designed especially but not exclusively for use as a dummy antenna in radio-broadcasting.

The use of power resistors in radiofrequency applications, especially in the medium-wave range, is necessary for example to carry out tests of electrical functioning as well as measurements of performance characteristics with a radio-broadcasting transmitter. To do this, the load, which is often called a dummy antenna, must possess high stability of impedance in terms of temperature and frequency so as not to cause fluctuations in the operation of the transmitter.

There is a known way, in RF applications, of making loads with water-cooled resistive elements: certain of these loads have high resistive stability up to some megahertz but have a major drawback: they require a water-cooling circuit. Now, such a circuit is costly and may be difficult to put into application.

In other loads, the resistor is formed by means of a portion of a circuit portion in which there flows water containing sodium carbonate. Certain of these loads are provided with tuning pistons to enable the adjusting of the temperature. Such loads can be used for high power values and show high temperature stability but have the drawback of requiring two water circuits, the circuit of water containing sodium carbonate and, in addition, an ordinary water circuit designed to cool the circuit of water containing sodium carbonate.

It must be noted that there is also a known way of making resistors by the so-called expanded metal technique, which consists in making a multitude of parallel slots in a metal band without removing any material but in pushing apart the edges of the slots in such a way as to form a sort of meshwork. Resistors such as these, placed end to end, are used in fields such as electrical traction, industrial electrical heating and electrical power braking in certain trains: the loads thus constituted have high temperature stability but low stability in frequency and therefore cannot be used as dummy antennas if a wide band of operating frequencies should be desired. In this respect, it must be noted that the new radiofrequency power sources in MOSFET technology are highly sensitive to load variations owing to their very low dynamic internal impedance and that, consequently, the stability of the load must be ensured beyond the working frequencies, generally up to the third harmonic of the highest working frequency.

SUMMARY OF THE INVENTION

The present invention is aimed at proposing an air-cooled power load having high stability in temperature and frequency and a cost price that is appreciably lower than that of piston-regulated loads using soda water circuits.

This is obtained by using an assembly of series-connected resistor modules made of expanded metal and by associating a system of frequency compensation with this assembly.

According to the invention, there is provided an air-cooled power load usable in radiofrequencies, comprising a series-connected assembly of resistor modules, each of these modules being substantially plane, made of expanded metal and having two ends, a metal support structure, insulator elements to hold the assembly and frequency compensation means, these compensation means comprising capacitive links, each of the capacitive links connecting one of the ends of one among certain of the modules to the support structure.

BRIEF DESCRIPTION OF THE DRAWINGS

The present invention shall be understood more clearly and other characteristics shall emerge from the following description and from the figures pertaining thereto, of which.

In the different figures, the corresponding elements are designated by the same references.

MORE DETAILED DESCRIPTION

Figure 1:
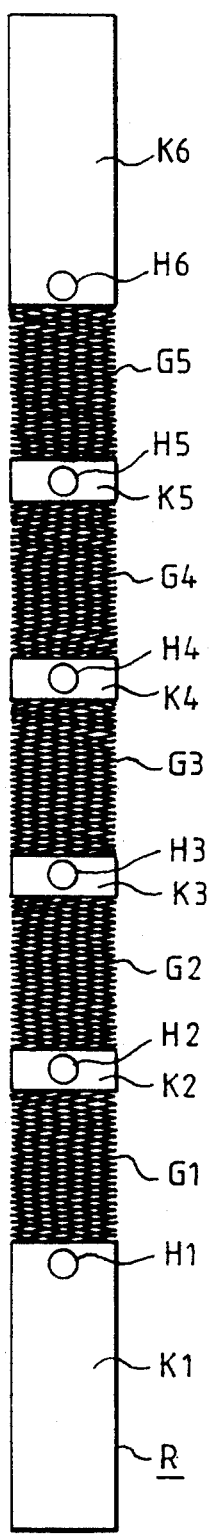
FIG. 1 shows a resistor module used in the load according to the invention.

FIG. 1 shows a resistor module R, obtained by the expanded metal technique, made from a metal band with a width of 9 cm and a thickness of 0.18 mm. This module comprises, alternating along the metal band, meshwork portions G1–G5 made of expanded metal and portions K1–K6 without meshwork with a hole H1–H6 pierced through them. There are five meshwork portions per module. They have a length of 13.7 cm each. The portions K2 to K5 without meshwork each take up a length of 2.8 cm on the band while the portions K1 and K6 without meshwork that are at the end of the module have a length of 22.5 cm each and constitute tongues designed to be used for the connection of the module. The resistor module according to the invention, as made, has a resistance of 1.04 ohm.

Figure 2:
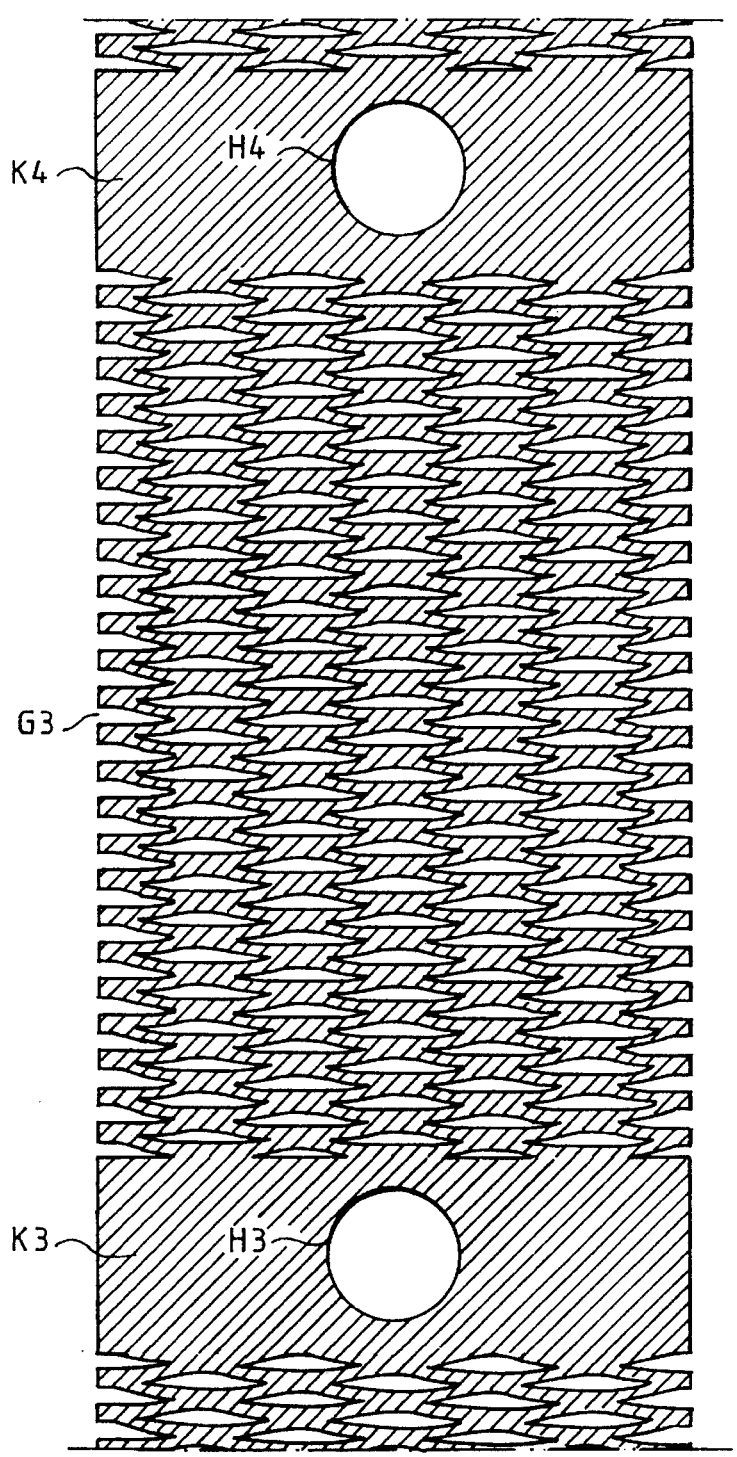
FIG. 2 shows a part of the resistor module according to the invention.

FIG. 2 is a partial enlarged view of a part of FIG. 1 with, in particular, the meshwork portion G3 and the holes H3 and H4.

Figure 3:
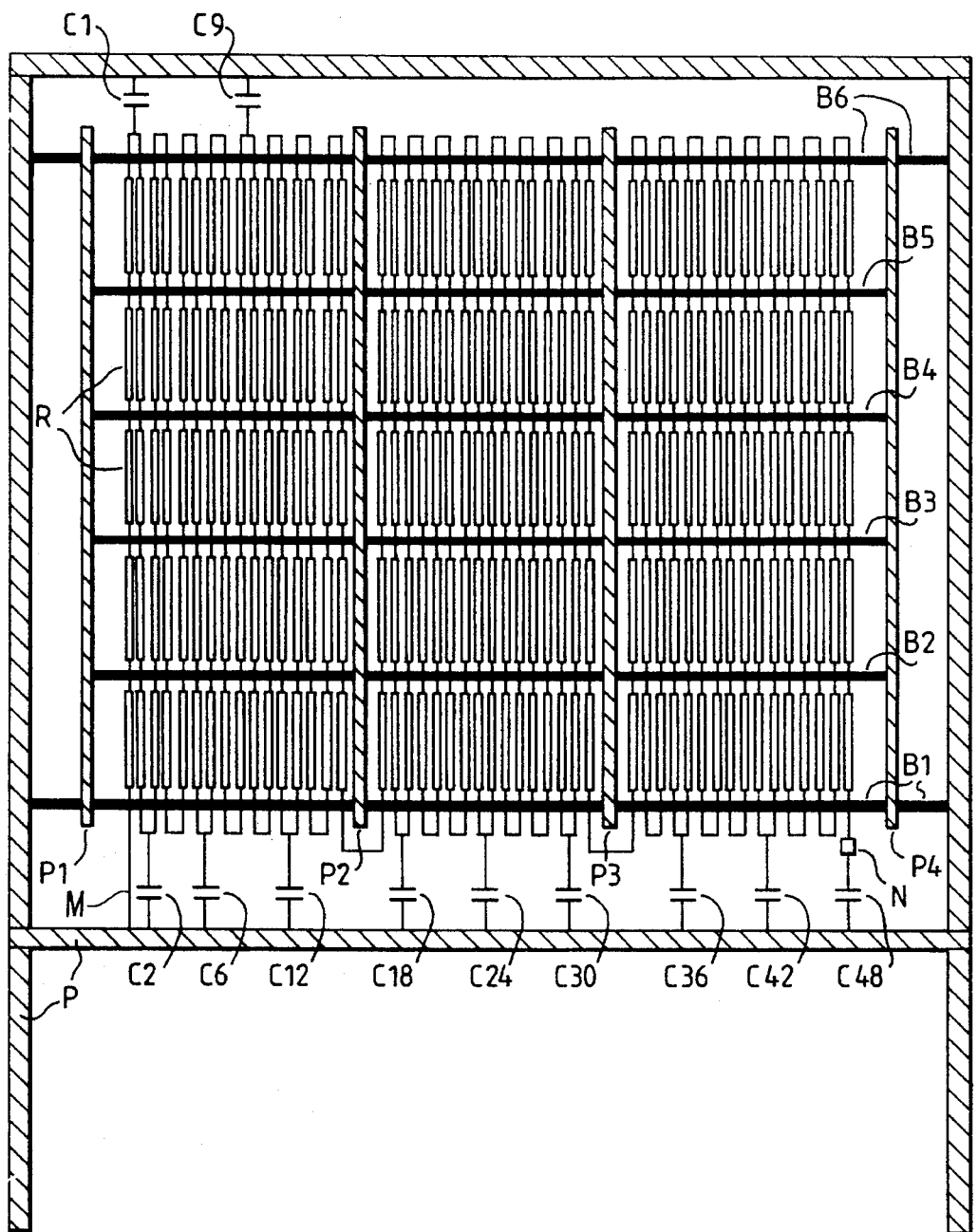
FIGS. 3 and 4 show a load according to the invention, shown in a front and side view.
Figure 4:
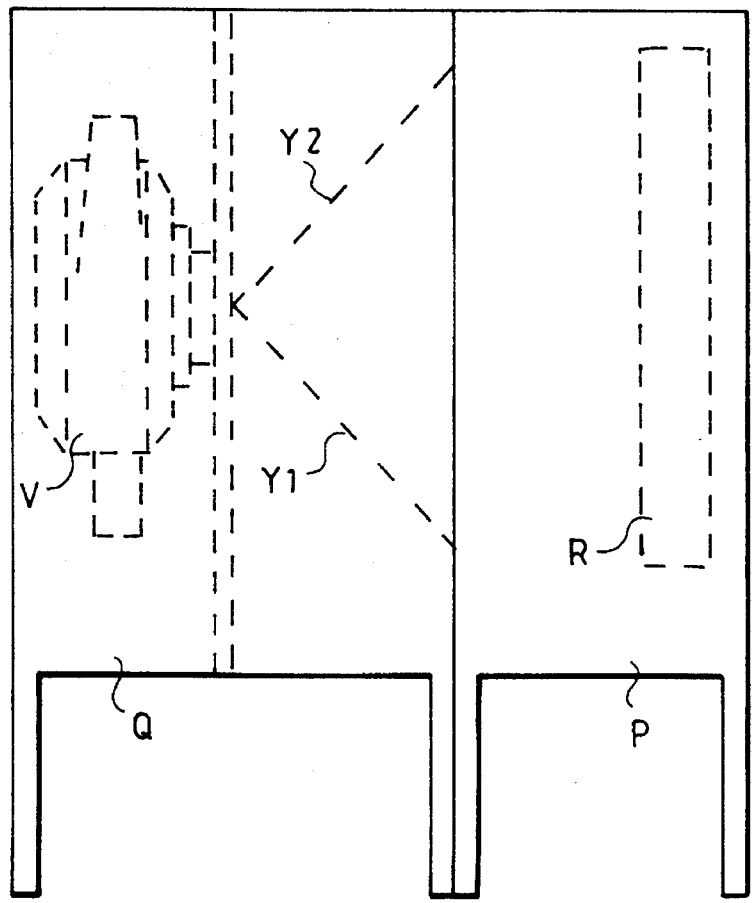
Figure 5:
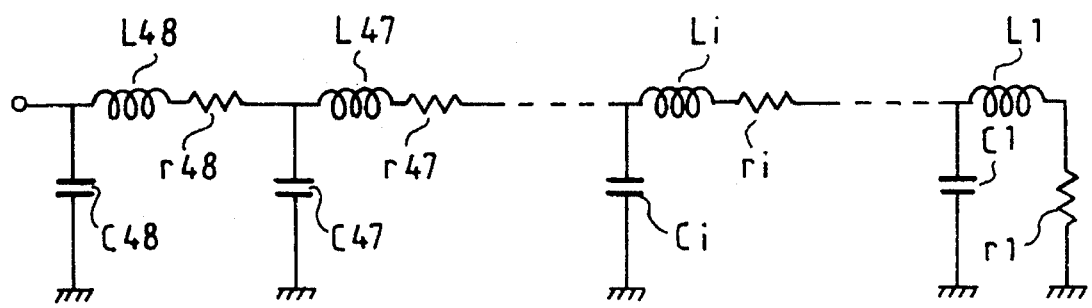
FIG. 5 shows an electrical diagram pertaining to the load according to FIGS. 3 and 4.

FIGS. 3 and 4 are simplified views showing how 48 modules according to FIG. 1 are series-connected to constitute a 40-ohm, 150-kW power load designed to be used as a dummy antenna.

FIG. 3 shows the load seen in a front view with the 48 modules such as R, series-connected in the vertical planes perpendicular to the plane of the figure. The meshwork portions of the modules are represented by elongated rectangles while the portions without meshwork are represented by unbroken lines. The 48 modules are held inside a metal rack P without a front face and without a rear face but having, inside, six horizontal insulating bars B1–B6 that go through the holes of the modules and four vertical metal plates P1–P4 parallel to the planes of the modules and, therefore, perpendicular to the plane of FIG. 3. The plates P1–P4 separate the modules geographically into three groups of 16 modules but, electrically, the three groups are series-connected. The module furthest to the left in FIG. 3 is connected to the metal rack P by a link M while the module furthest to the right is connected to an access terminal N of the load, symbolized by a rectangle.

FIG. 4 shows the load seen in a side view with the metal rack P and another metal rack Q having neither a front nor a rear, attached to the rack P. The contents of the racks P and Q are shown as if seen by transparency. For the rack P, these contents have been represented schematically by the resistor module, R, of FIG. 3. The rack Q, for its part, contains a ventilator v, with a blower output of 23000 m3/h and deflection plates Y1, Y2. The ventilator V takes in air from the space located, in FIG. 3, to the left of the rack Q and blows it through the plates Y1, Y2 on to the resistor modules such as R.

On the electrical plane, the load according to FIGS. 3 and 4 may be likened to a series assembly of 48 quadripoles, each having a capacitor C1 ... Cio ... C47, C48 in a branching connection, and an inductor L1 ... Li ... L47, L48 and a resistor r1 ... ri ... r47 ... r48 in series. The resistors have a value of 1.04 ohms as indicated in the description of FIG. 1. For their part, the inductors and capacitors, for a power load made in a standard way, are parasitic capacitors and inductors. In the embodiment described herein, certain of these capacitors C1, C2, C6, C9, C12, C18, C24, C30, C36, C42, C48 are actually constituted by the sum of a parasitic capacitance, on the one hand, and of a given capacitance of a fixed capacitor, on the other hand. These fixed capacitors are mounted between the wall of the metal rack P and the end of certain of the resistor modules. They are designed to compensate for the load in its frequencies of use in such a way that they have an acceptable standing wave ratio (SWR). For this purpose, as a function of the constituent elements of the circuit, the SWR is computed at the input of the load. This computation is done with a view to obtaining the desired SWR by means of a minimum number of appropriately distributed capacitors. What is done therefore is an optimization and, in fact, it is not a computation of SWR that is performed but a succession of SWR computations, these computations pertaining to different modes of distribution of capacitors along the resistive load proper and to different values attributed to these capacitors. In the example described, where the desired SWR should not exceed 1.15 from 0 to 1.7 MHz and should not exceed 1.5 from 1.7 to 5 MHz, these successive computations have led resulting in taking eleven capacitors distributed as indicated in FIG. 3 and having the following characteristics:

| C1: 100 nF, | 88 V eff, | 89 A eff |
| --- | --- | --- |
| C2: 24 nF, | 122 V eff, | 29 A eff |
| C6: 3.3 nF, | 466 V eff, | 16 A eff |
| C9: 2.2 nF, | 726 V eff, | 16 A eff |
| C12: 1.8 nF, | 948 V eff, | 17 A eff |
| C18: 1.5 nF, | 1327 V eff, | 20 A eff |
| C24: 920 pF, | 1633 V eff, | 15 A eff |
| C30: 560 pF, | 1905 V eff, | 11 A eff |
| C36: 330 pF, | 2171 V eff, | 7 A eff |
| C42: 240 pF, | 2450 V eff, | 6 A eff |
| C48: 160 pF, | 2740 V eff, | 5 A eff |

The above list gives the value, for each of the eleven capacitors, of its capacitance as well as its virtual voltage and virtual current in nominal operation mode. It must be noted that the capacitance values are standardized values, the computations having been made on the basis of such values.

Figure 6:
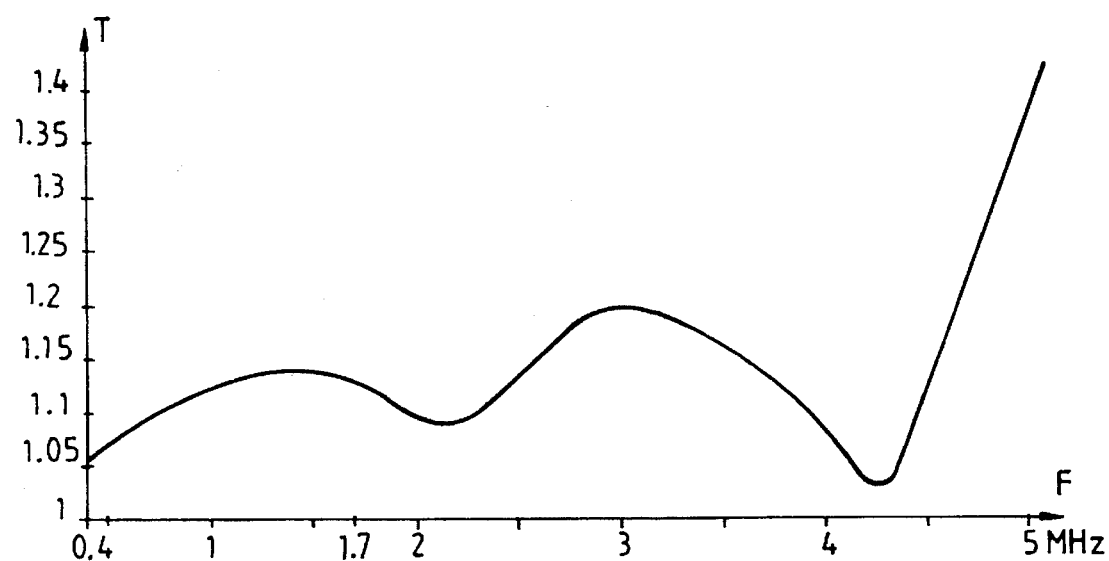
FIG. 6 shows a curve representing a characteristic of the load according to FIGS. 3 and 4.

FIG. 6 shows the curve of variation of the standing wave ratio, T, as a function of the frequency F at input of the load that has just been described. This curve shows that the standing wave ratio is below 1.15 not only up to 1.7 MHz as desired but also up to slightly more than 2.5 MHz. The curve also shows that, up to 5 MHz, the standing wave ratio not only does not exceed 1.5 but remains lower than or equal to 1.4.

Figure 7:
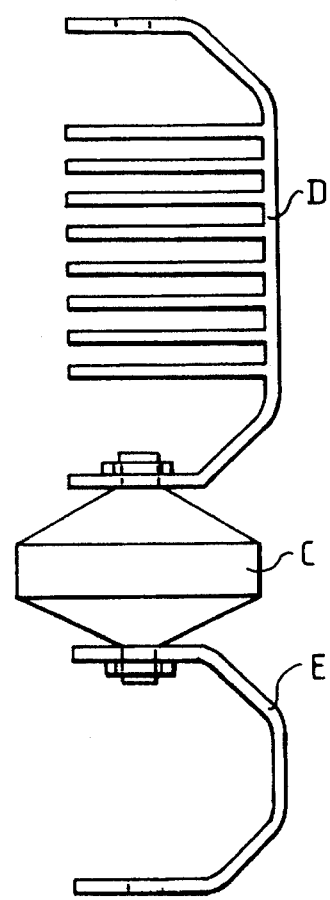
FIG. 7 shows components used in the load according to FIGS. 3 and 4.

FIG. 7 shows an exemplary view of the way to show a capacitor C between the wall of the metal rack P and the resistor modules. The capacitor C is connected to the resistor modules by a ribbed radiator D and is connected to the wall of the rack by a metal strap E. The ribbed radiator is designed to provide a temperature gradient between the resistor module whose temperature may reach 300° and the capacitor, this temperature gradient being sufficient to prevent the capacitor from being damaged. In the example shown, the capacitor is fitted out with screw type outputs. In the case of capacitors provided with wire-based outputs, by tongues or outputs of any other type, the radiator D and the strap E are matched to the outputs considered as also are the connections between these parts and the outputs of the capacitor which are connections provided by soldering, screws or other means.

The present invention is not limited to the example described. It extends to all the embodiments of loads using expanded metal resistor elements comprising a frequency compensation circuit formed by branch-connected capacitors distributed along the resistor element. In particular, the invention applies to such embodiments even if they have no forced ventilation system but only by natural convection of ambient air, and are therefore far more limited in terms of power.

What is claimed is:

1. An air-cooled power load usable in radiofrequencies, comprising a series-connected assembly of resistor modules, each of these modules being substantially plane, made of expanded metal and having two ends, a metal support structure, insulator elements to hold the assembly and frequency compensation means, these compensation means comprising capacitive links, each of the capacitive links connecting one of the ends of one among certain of the modules to the support structure.

2. A load according to claim 1, comprising ventilation means to provide for a forced ventilation of the modules in which the compensation frequency means are localized at places where they too undergo a forced ventilation by the ventilation means.

3. A load according to claim 1, wherein at least certain of the capacitive links are dissipative links that comprise, in series, a capacitor and an energy-dissipating element.

4. A load according to claim 2, wherein at least certain of the capacitive links are dissipative links that comprise, in series, a capacitor and an energy-dissipating element.

5. A load according to claim 3 wherein, in each of the dissipative links, the energy-dissipating element is a radiator with ribs positioned in first mutually parallel planes and wherein each of the modules, one end of which connected to the support structure by a dissipative link, is positioned in a second plane parallel to the first planes relating to the dissipative link by which one of its ends is linked to the support structure.

6. A load according to claim 4 wherein, in each of the dissipative links, the energy dissipating element is a radiator with ribs positioned in first mutually parallel planes and wherein each of the modules, one end of which connected to the support structure by a dissipative link, is positioned in a second plane parallel to the first planes relating to the dissipative link by which one of its ends is linked to the support structure.

* * * * *